(12) United States Patent
Cheng et al.

(10) Patent No.: US 11,489,079 B2
(45) Date of Patent: Nov. 1, 2022

(54) OPTICAL SENSOR STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Wei-Te Cheng, Taipei (TW); Kai-Chieh Liang, New Taipei (TW); Jie-Ting Tsai, New Taipei (TW); Bo-Jhih Chen, New Taipei (TW); Zi-Jun Lin, Taipei (TW); Kuo-Ming Chiu, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 17/324,267

(22) Filed: May 19, 2021

(65) Prior Publication Data
US 2021/0367085 A1    Nov. 25, 2021

Related U.S. Application Data

(60) Provisional application No. 63/028,617, filed on May 22, 2020.

(30) Foreign Application Priority Data

Dec. 14, 2020   (CN) .......................... 202011467529.6

(51) Int. Cl.
*H01L 31/0232* (2014.01)
*H01L 31/0203* (2014.01)
(Continued)

(52) U.S. Cl.
CPC ........ *H01L 31/0203* (2013.01); *H01L 25/167* (2013.01); *H01L 31/02325* (2013.01); *H01L 31/09* (2013.01); *H01L 31/108* (2013.01)

(58) Field of Classification Search
CPC ........... H01L 31/0203; H01L 31/02325; H01L 31/09; H01L 31/108; H01L 25/167
(Continued)

(56) References Cited

U.S. PATENT DOCUMENTS 6,445,670 B1 *  9/2002  Oshima .................. G11B 7/127
8,835,981 B2 *  9/2014  Oishi .................. H01L 27/1464
                                                        438/70
(Continued)

*Primary Examiner* — Calvin Y Choi
(74) *Attorney, Agent, or Firm* — Li & Cai Intellectual Property (USA) Office

(57) ABSTRACT

An optical sensor structure is provided. The optical sensor structure includes a substrate, a light sensing unit, a peripheral wall, and a reflective layer. The substrate includes a plurality of metal pads. The light sensing unit is disposed on the substrate and electrically connected to the plurality of metal pads. The peripheral wall is disposed on the substrate, and the peripheral wall and the substrate define an accommodating space. The metal pads and the light sensing unit are positioned in the accommodating space. The reflective layer is disposed in the accommodating space and surrounds the light sensing unit.

18 Claims, 7 Drawing Sheets

(51) Int. Cl.
　　　*H01L 25/16*　　　(2006.01)
　　　*H01L 31/108*　　(2006.01)
　　　*H01L 31/09*　　　(2006.01)
(58) Field of Classification Search
　　　USPC .......................................................... 257/432
　　　See application file for complete search history.

(56) References Cited

U.S. PATENT DOCUMENTS

| | | | |
|---|---|---|---|
| 2015/0295002 A1* | 10/2015 | Kang | H01L 27/14636 |
| | | | 438/70 |
| 2017/0097466 A1* | 4/2017 | Dobrinsky | G02B 6/10 |
| 2021/0157142 A1* | 5/2021 | Scheller | H01L 24/08 |

* cited by examiner

OPTICAL SENSOR STRUCTURE

CROSS-REFERENCE TO RELATED PATENT APPLICATION

This application claims priority to the U.S. Provisional Patent Application Ser. No. 63/028,617 filed on May 22, 2020, and to China Patent Application No. 202011467529.6 filed on Dec. 14, 2020 in People's Republic of China, both of which applications are incorporated herein by reference in their entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optical sensor structure, and more particularly to a high performance optical sensor structure.

BACKGROUND OF THE DISCLOSURE

Optical sensors are sensor assemblies that can sense light or other electromagnetic energy, and have widespread applications. Generally, commercially available ultraviolet (UV) germicidal equipment adopts UV sensors to detect UV light. Since an intensity of UV light determines germicidal efficiency, the intensity of the UV light that is detected can be used to alert a user whether a product needs to be replaced.

The main factor in evaluating the performance of the optical sensor is photocurrent and response time. However, for an existing UV sensor, it is difficult to maintain both at a satisfactory level. In other words, performance-wise, while a conventional optical sensor structure may have sufficient photocurrent, the response time may be too long. Or, the response time may be short enough, but the photocurrent may be insufficient.

Therefore, how the structural design of the optical sensor can be improved, so as to uphold both the photocurrent and the response time and overcome the above-mentioned problems, has become one of the important issues to be solved in the field.

SUMMARY OF THE DISCLOSURE

In response to the above-referenced technical inadequacy, the present disclosure provides an optical sensor structure that includes a substrate, a light sensing unit, a peripheral wall, and a reflective layer. The substrate includes a plurality of metal pads. The light sensing unit is disposed on the substrate and electrically connected to the plurality of metal pads. The peripheral wall is disposed on the substrate, and the peripheral wall and the substrate define an accommodating space. The metal pads and the light sensing unit are positioned in the accommodating space. The reflective layer is disposed in the accommodating space and surrounds the light sensing unit.

Preferably, the light sensing unit is disposed on one of the plurality of metal pads.

Preferably, the light sensing unit is a Schottky diode or a photoresistor.

Preferably, an upper surface of the light sensing unit is coated with a thin film, and a material of the thin film is silicone or fluoropolymer.

Preferably, a refractive index of the thin film is less than that of the light sensing unit.

Preferably, the reflective layer is inclined upward from the light sensing unit toward the peripheral wall.

Preferably, the reflective layer includes silicone or fluoropolymer.

Preferably, the reflective layer includes a dopant, and the dopant is one or more selected from the group consisting of: polytetrafluoroethylene, fluorinated ethylene propylene, polyfluoroalkoxy, ethylene-tetra-fluoro-ethylene, and zirconium dioxide.

Preferably, the dopant is 30% to 70% by weight of the reflective layer.

Preferably, the light sensing unit is rotated along a surface of the substrate by a rotation angle.

Preferably, the rotation angle is between 40 degrees and 50 degrees.

Preferably, the optical sensor structure further includes a base layer that is disposed in the accommodating space and surrounds the light sensing unit, and the base layer is positioned below the reflective layer.

Preferably, the base layer is selected from the group consisting of: silicone, fluoropolymer, polytetrafluoroethylene, fluorinated ethylene propylene, polyfluoroalkoxy, ethylene-tetra-fluoro-ethylene, and any combination thereof.

Preferably, an interface between the base layer and the reflective layer is not higher than an upper surface of the light sensing unit.

Preferably, the optical sensor structure further includes a lens unit that is stacked on the peripheral wall.

Preferably, the lens unit is a plano-convex lens, and a convex surface of the plano-convex lens faces the light sensing unit.

Preferably, the lens unit is a convex-concave lens, and a convex surface of the plano-convex lens faces the light sensing unit.

Preferably, a surface of the lens unit facing away from the light sensing unit is coated with an anti-reflection layer.

Preferably, the anti-reflection layer includes tantalum pentoxide and silicon dioxide stacked on top of each other, or hafnium dioxide and silicon dioxide stacked on top of each other.

Preferably, the optical sensor structure further includes a resistor electrically connected to the light sensing unit.

Preferably, the reflective layer covers the resistor.

Preferably, the resistor is disposed on the substrate and is connected in parallel with the light sensing unit.

Preferably, the resistor is disposed on the substrate, the light sensing unit is stacked on the resistor, and the resistor is connected in parallel with the light sensing unit.

One of the beneficial effects of the present disclosure is that, by the technical solution of "the reflective layer being disposed in the accommodating space and surrounding the light sensing unit", the optical sensor structure provided in the present disclosure can increase an amount of light incident to the light sensing unit in the optical sensor structure, thereby increasing a photocurrent generated by the light sensing unit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
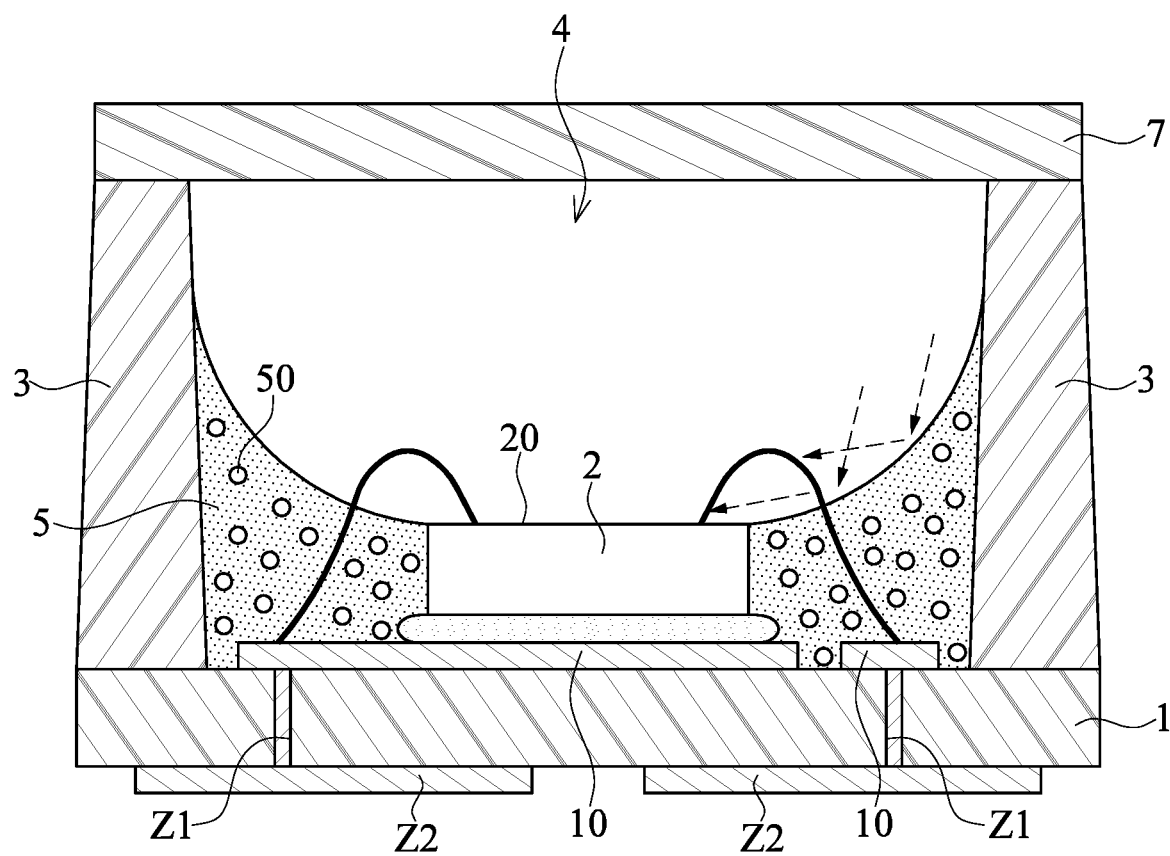
FIG. 1 is a schematic view of an optical sensor structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the present disclosure provides an optical sensor structure M that includes a substrate 1, a light sensing unit 2, a peripheral wall 3 and a reflective layer 5.

The substrate 1 includes a plurality of metal pads 10, and the plurality of metal pads 10 are disposed on one side of the substrate 1 and electrically connected to external electrodes Z2 disposed on another side of the substrate 1 through conductive pillars Z1. The substrate 1 can be, for example, a printed circuit board (PCB), but the present disclosure is not limited thereto. The light sensing unit 2 is disposed on the substrate 1 and electrically connected to the plurality of metal pads 10. The plurality of metal pads 10 have different polarities, and can be an anode or a cathode. For example, the light sensing unit 2 is disposed on one of the plurality of metal pads 10, i.e., the light sensing unit 2 can be fixed to one of the metal pads 10 of the substrate 1 through a conductive silver adhesive, and then wires are connected to one of the metal pads 10 that is an anode and one of the metal pads 10 that is a cathode through a wire-bonding process. The optical sensor structure M is a sensor that converts light signals into electronic signals using the light sensing unit 2. In the present disclosure, the light sensing unit 2 may be a Schottky diode or a photoresistor, but the present disclosure is not limited thereto.

Reference is further made to FIG. 1, in which the peripheral wall 3 is disposed on the substrate 1, and the peripheral wall 3 and the substrate 1 define an accommodating space 4. The plurality of metal pads 10 and the light sensing unit 2 are positioned in the accommodating space 4. The reflective layer 5 is also positioned in the accommodating space 4. It should be noted that, although the figures shown in the present disclosure are planar, the optical sensor structure M provided in the present disclosure is actually a three-dimensional structure. Therefore, the reflective layer 5 surrounds the light sensing unit 2. Preferably, an upper surface 20 of the light sensing unit 2 is not covered by the reflective layer 5, and is completely exposed in the accommodating space 4. However, in other embodiments not shown in the figures, the reflective layer 5 covers portions of the upper surface 20 of the light sensing unit 2. All above-mentioned configurations fall within the scope of the present disclosure.

In addition, the optical sensor structure M of the present disclosure further includes a lens unit 7, and the lens unit 7 is stacked on the peripheral wall 3. Deep ultraviolet (deep UV) light is incident to an inside of the optical sensor structure M through the lens unit 7 and is received by the light sensing unit 2. It should be noted that, the short wavelength deep UV light is mainly received by the upper surface 20 of the light sensing unit 2 when the short wavelength deep UV light from the external environment is incident to the inside of the optical sensor structure M.

Referring further to FIG. 1, the reflective layer 5 is not only disposed surrounding the light sensing unit 2, the reflective layer 5 is inclined upward from the light sensing unit 2 toward the peripheral wall 3. For example, a base material of the reflective layer 5 is silicone or fluoropolymer. However, the present disclosure is not limited to the above-mentioned example. The reflective layer 5 surrounds the light sensing unit 2 to form a reflective structure. When the light L from the external environment is incident to the accommodating space 4, apart from being directly incident on the upper surface 20 of the light sensing unit 2, portions of the light L not directly incident to the light sensing unit 2 are reflected (as shown by arrows in FIG. 1) by the reflective layer 5 to the upper surface 20 of the light sensing unit 2, such that the upper surface 20 of the light sensing unit 2 receives light signals and converts the light signals into electronic signals (i.e., the light sensing unit 2 generates a photocurrent). That is, the optical sensor structure M provided in the present disclosure can increase the amount of the light incident to the light sensing unit 2 by the reflection of the reflective layer 5, thereby increasing the photocurrent generated.

Furthermore, the reflective layer 5 includes a dopant 50. For example, the dopant 50 is one or more selected from the group consisting of: polytetrafluoroethylene (PTFE), fluorinated ethylene propylene (FEP), polyfluoroalkoxy (PFA), ethylene-tetra-fluoro-ethylene (ETFE), and zirconium dioxide. However, the present disclosure is not limited to the above-mentioned example.

In the present disclosure, the dopant 50 is 30% to 50% by weight of the total weight of the reflective layer 5. However, the percentage by weight of the dopant 50 present in the reflective layer 5 varies from one kind of the dopant 50 to another. Preferably, the dopant 50 is 30% to 70% by weight of the total weight of the reflective layer 5.

Second Embodiment

Figure 2:
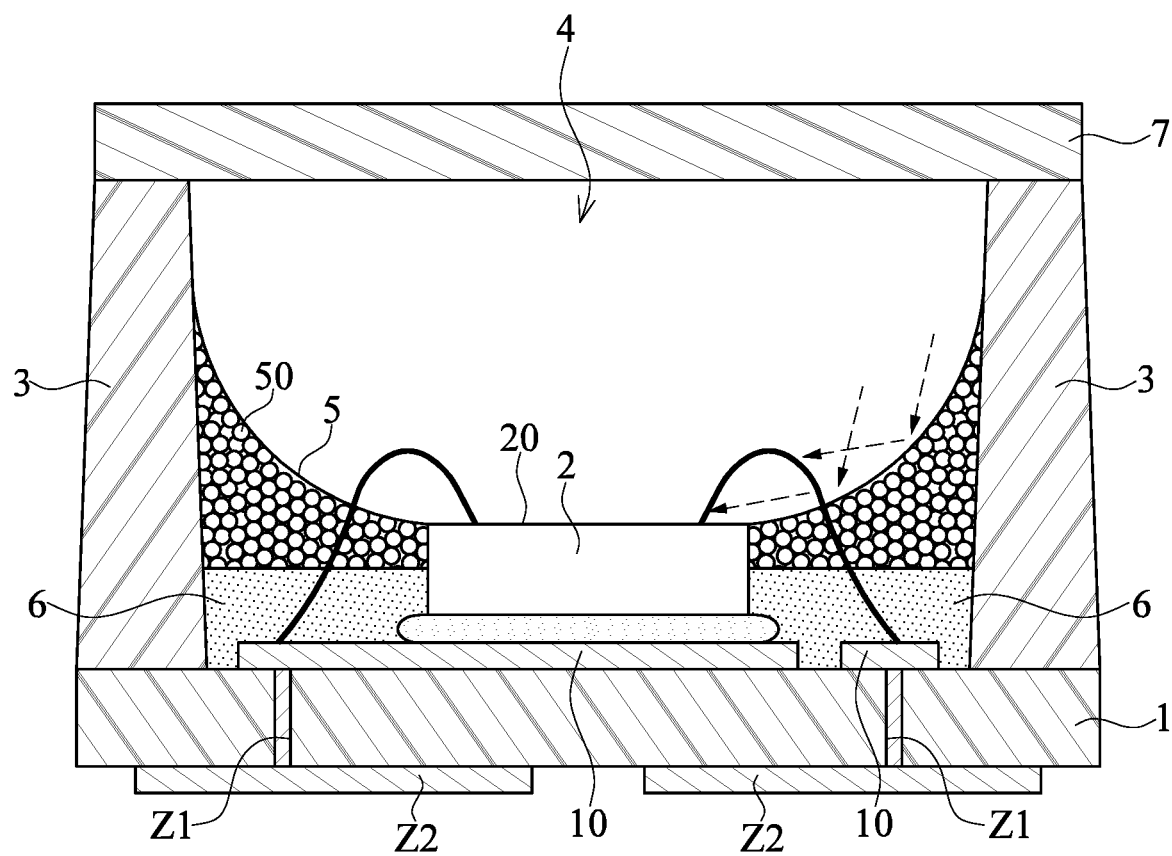
FIG. 2 is a schematic view of the optical sensor structure according to a second embodiment of the present disclosure.

Referring to FIG. 2, a second embodiment is different from the first embodiment in that the optical sensor structure M provided in the second embodiment of the present disclosure further includes a base layer 6. Other components of the optical sensor structure M provided in the second embodiment have a structure similar to that of the first embodiment described above and are not reiterated herein.

The optical sensor structure M includes the substrate 1, the light sensing unit 2, the peripheral wall 3, the reflective layer 5, the base layer 6, and the lens unit 7. The substrate 1 includes the plurality of metal pads 10, and the light sensing unit 2 is disposed on the substrate 1 and electrically connected to the plurality of metal pads 10. The peripheral wall 3 is disposed on the substrate 1, and the peripheral wall 3 and the substrate 1 define the accommodating space 4. The plurality of metal pads 10 and the light sensing unit 2 are positioned in the accommodating space 4. The reflective layer 5 is also positioned in the accommodating space 4. The reflective layer 5 surrounds the light sensing unit 2, and the upper surface 20 of the light sensing unit 2 is exposed in the accommodating space 4 and not covered by the reflective layer 5. The lens unit 7 is stacked on the peripheral wall 3. The base layer 6 is disposed in the accommodating space 4 and surrounds the light sensing unit 2, and the base layer 6 is positioned below the reflective layer 5. In other words, the base layer 6 is positioned between the reflective layer 5 and the substrate 1. In addition, it should be noted that a contact surface S of the base layer 6 and the reflective layer 5 is not higher than the upper surface 20 of the light sensing unit 2.

The base layer 6 is positioned between the reflective layer 5 and the substrate 1, and is mainly used to support the reflective layer 5, so as to prevent the dopant 50 inside the reflective layer 5 from sinking when the reflective layer 5 is cured. A composition of the base layer 6 can be the same as or different from a composition of the reflective layer 5. For example, a material of the base layer 6 is selected from the group consisting of: silicone, fluoropolymer, polytetrafluoroethylene, fluorinated ethylene propylene, polyfluoroalkoxy, ethylene-tetra-fluoro-ethylene and any combination thereof. However, the present disclosure is not limited to the above-mentioned example.

Third Embodiment

Figure 3A:
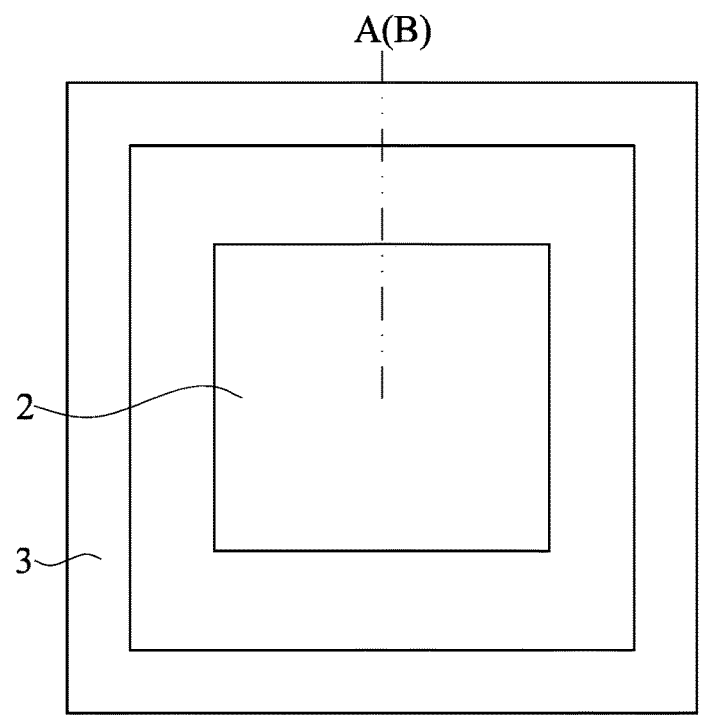
FIG. 3A is a schematic top view of the optical sensor structure according to the first embodiment of the present disclosure.
Figure 3B:
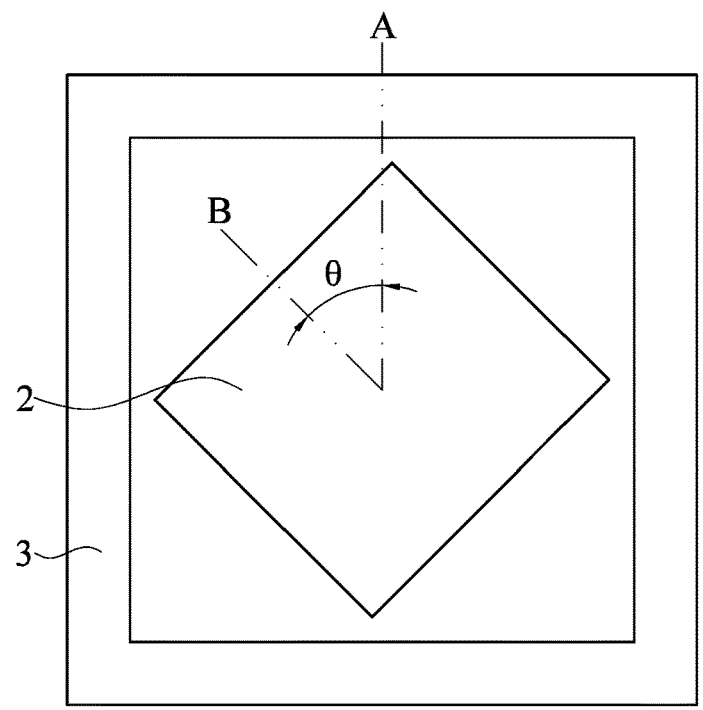
FIG. 3B is a schematic top view of the optical sensor structure according to a third embodiment of the present disclosure.

Referring to FIG. 1, FIG. 3A and FIG. 3B, a third embodiment is different from the above-mentioned first embodiment in that the light sensing unit 2 of the optical sensor structure M provided in the third embodiment is rotated by a rotation angle θ along a surface of the substrate 1. Other components of the optical sensor structure M provided in the third embodiment have a structure similar to that of the previous embodiments and are not reiterated herein.

As mentioned above, the optical sensor structure M includes the substrate 1, the light sensing unit 2, the peripheral wall 3 and the reflective layer 5. The substrate 1 includes the plurality of metal pads 10, and the light sensing unit 2 is disposed on the substrate 1 and electrically connected to the plurality of metal pads 10. The peripheral wall 3 is disposed on the substrate 1, and the peripheral wall 3 and the substrate 1 define the accommodating space 4. The plurality of metal pads 10 and the light sensing unit 2 are positioned in the accommodating space 4, and the reflective layer 5 is also positioned in the accommodating space 4. The reflective layer 5 surrounds the light sensing unit 2, and the upper surface 20 of the light sensing unit 2 is exposed in the accommodating space 4 and not covered by the reflective layer 5.

As a comparison, FIG. 3A is a top schematic view of the optical sensor structure according to the first embodiment, and FIG. 3B is a top schematic view of the optical sensor structure according to the third embodiment of the present disclosure. As shown in FIG. 3B, in the optical sensor structure M of the third embodiment of the present disclosure, the light sensing unit 2 is rotated along the surface of the substrate 1 by the rotation angle θ. For example, an axis A is defined along the center of the substrate 1, another axis B is defined along the center of the light sensing unit 2, and an included angle θ (i.e., the rotation angle θ) is formed between the axis A and the axis B. In the first embodiment, the axis A and the axis B are overlapped with each other and the rotation angle θ is 0 degrees, i.e., the light sensing unit 2 is not rotated relative to the substrate 1. In the third embodiment, the included angle θ between the axis A and the axis B can be between 40 degrees to 50 degrees. That is, the light sensing unit 2 is rotated by 40 degrees to 50 degrees relative to the substrate 1.

In one preferred embodiment of the present disclosure, the rotation angle θ may be 45 degrees. Compared to the light sensing unit 2 in the first embodiment that is not rotated relative to the substrate 1, when the rotation angle θ of the light sensing unit 2 in the third embodiment is 45 degrees, the light sensing unit 2 in the third embodiment can generate a photocurrent that is further increased by more than 2%.

Fourth Embodiment

Figure 4:
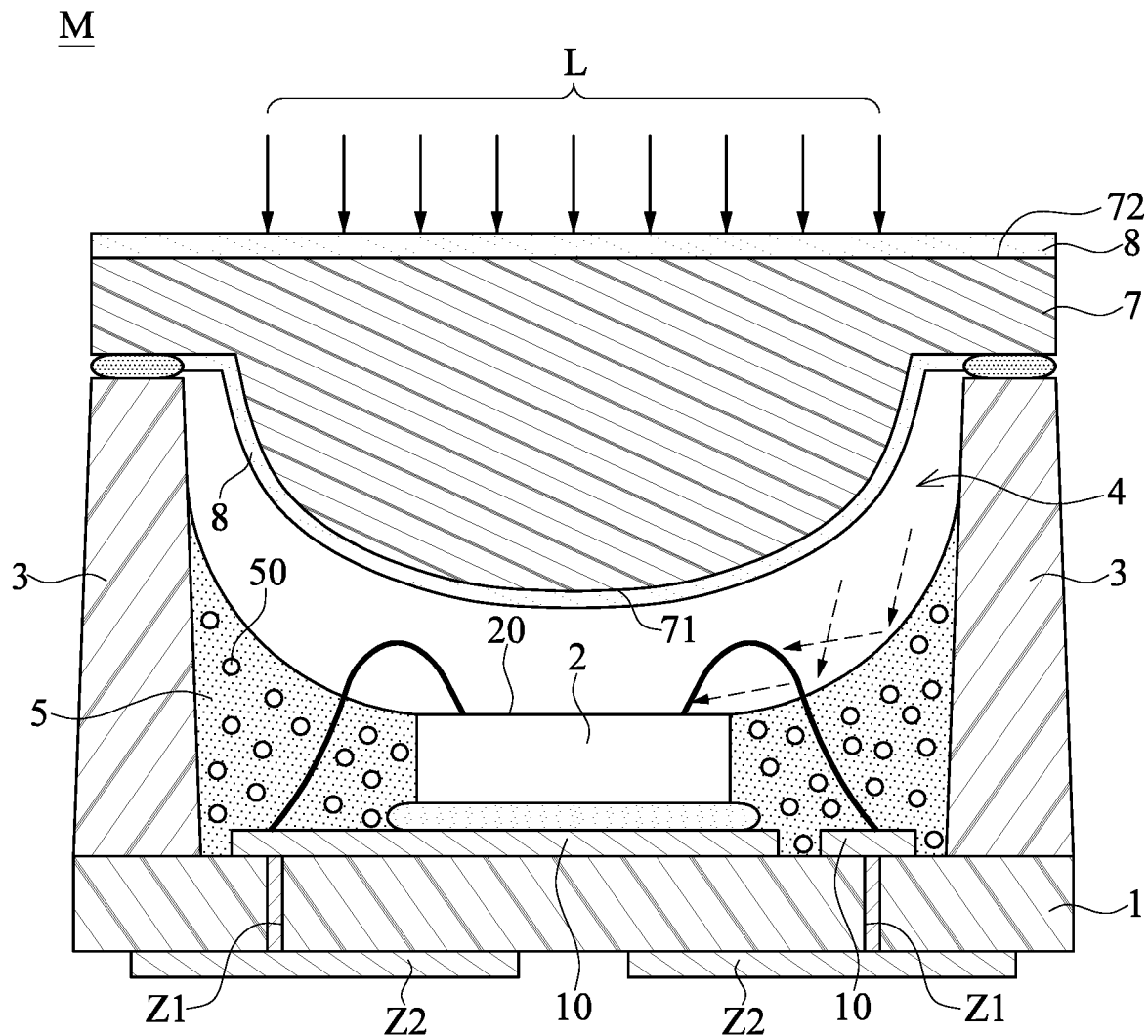
FIG. 4 is a schematic view of the optical sensor structure according to a fourth embodiment of the present disclosure.

Referring to FIG. 4, a fourth embodiment is different from the first embodiment in that the lens unit 7 of the optical sensor structure M provided in the fourth embodiment of the present disclosure has a different structure. In the above-mentioned first embodiment, the lens unit 7 of the optical sensor structure M is a planar lens, but in the fourth embodiment, the lens unit 7 of the optical sensor structure M is a plano-convex lens. That is, a surface 71 of the lens unit 7 is convex, and another surface 72 of the lens unit 7 is planar. In this embodiment, the surface 71 (i.e., a convex surface) of the lens unit 7 faces the light sensing unit 2, and the surface 72 (i.e., a planar surface) faces away from the light sensing unit 2. Therefore, the lens unit 7 can reduce a total reflection angle of the light incident to the inside of the optical sensor structure M and increase the light concentration effect, i.e., increasing the amount of the light incident directly on the upper surface 20 of the light sensing unit 2, thereby increasing the photocurrent generated.

As described above, the optical sensor structure M provided in the fourth embodiment of the present disclosure includes the substrate 1, the light sensing unit 2, the peripheral wall 3, the reflective layer 5, and the lens unit 7 (i.e., a plano-convex lens). The substrate 1 includes the plurality of metal pads 10. The light sensing unit 2 is disposed on the substrate 1 and electrically connected to the plurality of metal pads 10. The peripheral wall 3 is disposed on the substrate 1, and the peripheral wall 3 and the substrate 1 define the accommodating space 4. The plurality of metal pads 10 and the light sensing unit 2 are positioned in the accommodating space 4, and the reflective layer 5 is also positioned in the accommodating space 4. The reflective layer 5 surrounds the light sensing unit 2, and the upper surface 20 of the light sensing unit 2 is exposed in the accommodating space 4 and not covered by the reflective layer 5. The lens unit 7 is stacked on the peripheral wall 3.

Additionally, in the lens unit 7, the surface 71 facing the light sensing unit 2 and the surface 72 facing away from the light sensing unit 2 are each coated with an anti-reflection layer 8. The anti-reflection layer 8 may be an anti-reflective coating (ARC). The anti-reflection coating is a surface optical coating that can increase light transmission by reducing light reflection. In other words, the anti-reflection coating reduces the amount of scattered light generated when the light passes through the lens unit 7. The anti-reflection coating includes a combination of tantalum pentoxide and silicon dioxide or a combination of hafnium dioxide and silicon dioxide. More specifically, the components of the above-mentioned combination stack on top of each other to form the anti-reflection coating.

When the light from the external environment is incident to the accommodating space 4 through the lens unit 7, portions of the light are totally reflected and do not enter the accommodating space 4. Therefore, the anti-reflection layer 8 can reduce occurrence of total internal reflection and increase the amount of the light incident to the accommodating space 4 when the light passes through the lens unit 7. In other words, the anti-reflection layer 8 can reduce a total reflection angle of the incident light from the external environment. By increasing the portion of the light L from the external environment incident to the accommodating space 4 when passing through the lens unit 7, the amount of the light L from the external environment incident on the upper surface 20 of the light sensing unit 2 is increased, and more photocurrent is generated in the light sensing unit 2.

Fifth Embodiment

Figure 5:
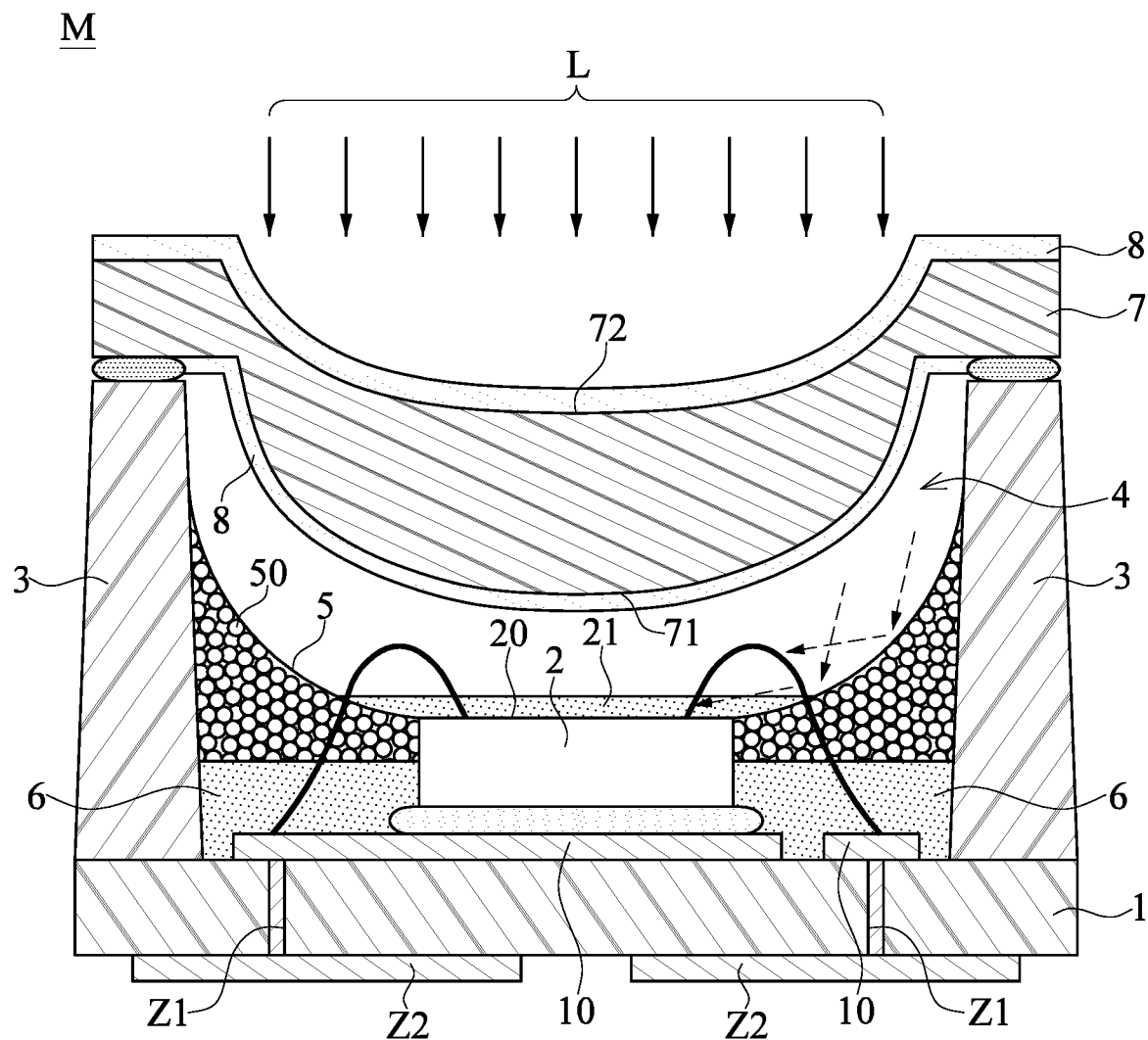
FIG. 5 is a schematic view of the optical sensor structure according to a fifth embodiment of the present disclosure.

Referring to FIG. 5, a fifth embodiment is different from the above-mentioned first embodiment and the fourth embodiment in that, the lens unit 7 of the optical sensor structure M provided in the fifth embodiment of the present disclosure has a different structure. In this embodiment, the lens unit 7 is a convex-concave lens. That is, the surface 71 of the lens unit 7 is convex, and the surface 72 of the lens unit 7 is concave. The surface 71 (i.e., a convex surface) of the convex-concave lens faces the light sensing unit 2, the surface 72 (i.e., a concave surface) faces away from the light sensing unit 2, and the surface 71 (i.e., a convex surface) and the surface 72 (i.e., a concave surface) are each coated with one layer of the anti-reflection layer 8.

When the light from the external environment is incident to the accommodating space 4 through the lens unit 7, portions of the light are totally reflected and do not enter the accommodating space 4. The convex-concave lens can reduce the portions of the light that are totally reflected when the light passes through the lens unit 7 and increase the amount of the light incident to the accommodating space 4 when the light passes through the lens unit 7. In other words, the convex-concave lens can reduce the total reflection angle of the incident light from the external environment. By increasing the portion of the light L from the external environment incident to the accommodating space 4 when passing through the lens unit 7, the amount of the light L from the external environment incident on the upper surface 20 of the light sensing unit 2 is increased, and more photocurrent is generated in the light sensing unit 2.

The lens unit 7 includes materials such as quartz, fluoropolymer or sapphire. In addition to the above-mentioned planar, plano-convex and convex-concave lenses, the lens unit 7 can also be a dome lens or a Fresnel lens. In other words, the present disclosure is not limited to the material and shape of the lens unit 7. The above-mentioned example is only one of the feasible embodiments, and is not intended to limit the scope of the present disclosure.

For example, the optical sensor structure M of the fifth embodiment of the present disclosure includes the substrate 1, the light sensing unit 2, the peripheral wall 3, the reflective layer 5, the base layer 6, and the lens unit 7 (i.e., a convex-concave lens). The substrate 1 includes the plurality of metal pads 10, and the light sensing unit 2 is disposed on the substrate 1 and electrically connected to the plurality of metal pads 10. The peripheral wall 3 is disposed on the substrate 1, and the peripheral wall 3 and the substrate 1 define the accommodating space 4. The plurality of metal pads 10 and the light sensing unit 2 are positioned in the accommodating space 4, and the reflective layer 5 is also positioned in the accommodating space 4. The reflective layer 5 surrounds the light sensing unit 2, and the upper surface 20 of the light sensing unit 2 is exposed in the accommodating space 4 and not covered by the reflective layer 5. The lens unit 7 is stacked on the peripheral wall 3. The base layer 6 is disposed in the accommodating space 4 and surrounds the light sensing unit 2, and the base layer 6 is positioned below the reflective layer 5. In the lens unit 7, the surface 71 facing the light sensing unit 2 and the surface 72 facing away from the light sensing unit 2 are each coated with the anti-reflection layer 8.

In addition, the upper surface 20 of the light sensing unit 2 is coated with a thin film 21, and a material of the thin film 21 is silicone or fluoropolymer. It is worth mentioning that a refractive index of the thin film 21 is less than that of the light sensing unit 2, and the refractive index of the thin film 21 is greater than the refractive index of air (which is 1). When the light is incident on the upper surface 20 of the light sensing unit 2, the light sequentially passes through the air and the thin film 21 before coming in contact with the upper surface 20 of the light sensing unit 2. That is, there is a gradual change of the refractive index along a path of the light incident on the upper surface 20 of the light sensing unit 2. Therefore, the total internal reflection of the light is reduced and the amount of the light incident on the upper surface 20 of the light sensing unit 2 is increased, so that the photocurrent generated is increased.

Sixth Embodiment

Figure 6:
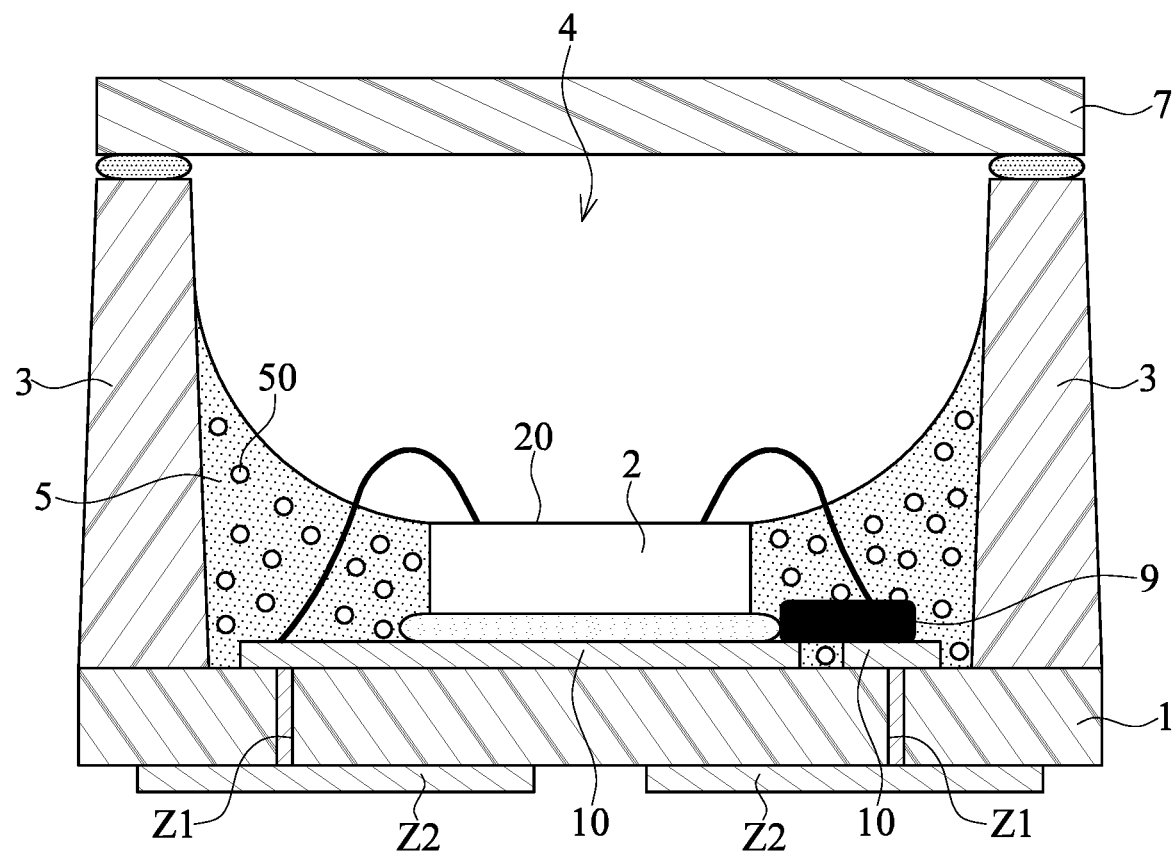
FIG. 6 is a schematic view of the optical sensor structure according to a sixth embodiment of the present disclosure.

Referring to FIG. 6, a sixth embodiment is different from the first embodiment in that, the optical sensor structure M provided in the sixth embodiment of the present disclosure further includes a resistor 9. Other components of the optical sensor structure M provided in the sixth embodiment have a structure similar to that of the previous embodiments and are not reiterated herein.

As described above, the optical sensor structure M provided in the sixth embodiment of the present disclosure includes the substrate 1, the light sensing unit 2, the peripheral wall 3, the reflective layer 5, the lens unit 7, and the resistor 9. The substrate 1 includes the plurality of metal pads 10. The light sensing unit 2 is disposed on the substrate 1 and electrically connected to the plurality of metal pads 10. The peripheral wall 3 is disposed on the substrate 1, and the peripheral wall 3 and the substrate 1 define the accommodating space 4. The plurality of metal pads 10 and the light sensing unit 2 are positioned in the accommodating space 4, and the reflective layer 5 is also positioned in the accommodating space 4. The reflective layer 5 surrounds the photo sensing module 2, and the upper surface 20 of the photo sensing module 2 is exposed in the accommodating space 4 and not covered by the reflective layer 5. The lens unit 7 is stacked on the peripheral wall 3. The resistor 9 is disposed on the substrate 1 and is electrically connected to the light sensing unit 2, and the reflective layer 5 covers the resistor 9. It is worth mentioning that the resistor 9 is connected in parallel with the light sensing unit 2 to form a parallel resistance.

Seventh Embodiment

Figure 7:
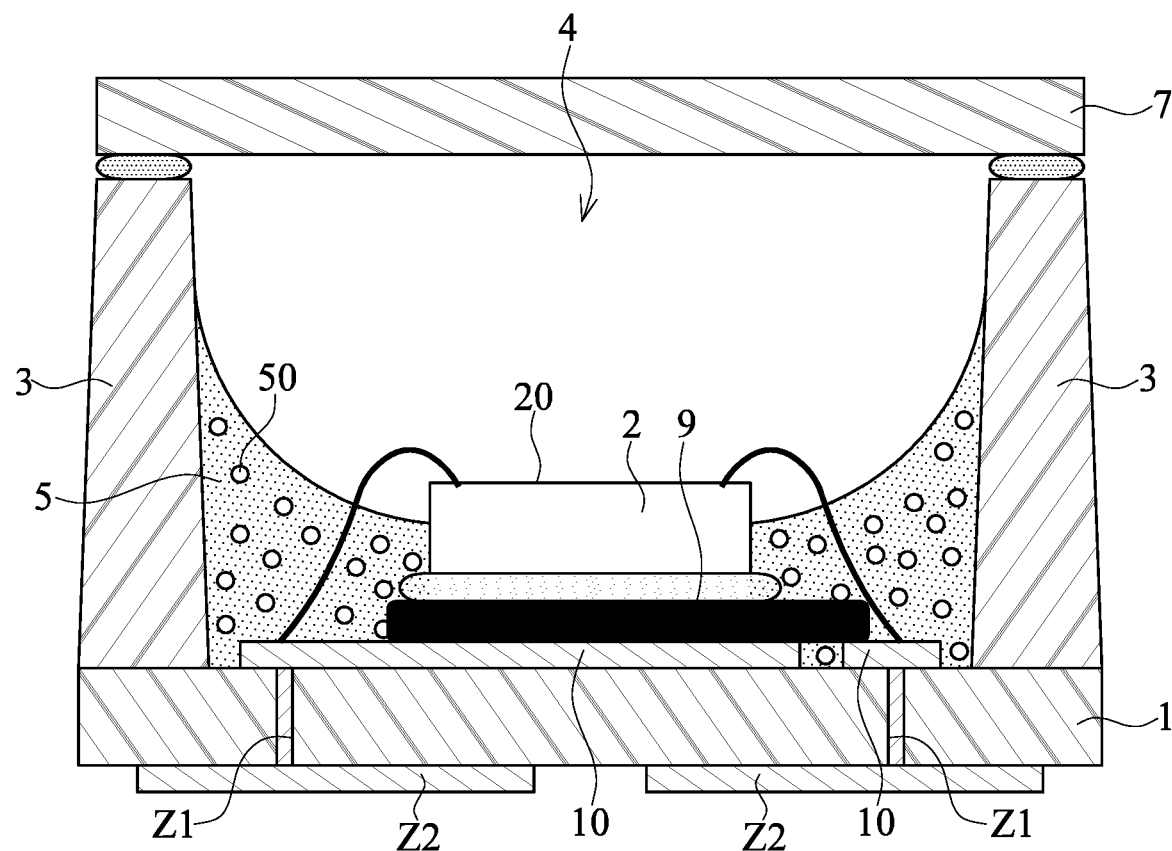
FIG. 7 is a schematic view of the optical sensor structure according to a seventh embodiment of the present disclosure.

Referring to FIG. 7, a seventh embodiment is different from the sixth embodiment in that the light sensing unit 2 of the optical sensor structure M provided in the seventh embodiment of the present disclosure is stacked on the resistor 9. Other components of the optical sensor structure M provided in the seventh embodiment have a structure similar to that of the previous embodiments and are not reiterated herein.

The optical sensor structure M of the seventh embodiment of the present disclosure includes the substrate 1, the light sensing unit 2, the peripheral wall 3, the reflective layer 5, the lens unit 7, and the resistor 9. The substrate 1 includes the plurality of metal pads 10, and the light sensing unit 2 is disposed on the substrate 1 and electrically connected to the plurality of metal pads 10. The peripheral wall 3 is disposed on the substrate 1, and the peripheral wall 3 and the substrate 1 define the accommodating space 4. The plurality of metal pads 10 and the light sensing unit 2 are positioned in the accommodating space 4, and the reflective layer 5 is also positioned in the accommodating space 4. The reflective layer 5 surrounds the photo sensing module 2, and the upper surface 20 of the photo sensing module 2 is exposed in the accommodating space 4 and not covered by the reflective layer 5. The lens unit 7 is stacked on the peripheral wall 3. The resistor 9 is disposed on the substrate 1, and the light sensing unit 2 is stacked on the resistor 9. The resistor 9 is electrically connected to the light sensing unit 2, and is connected in parallel with the light sensing unit 2 to form a parallel resistance. The reflective layer 5 covers the resistor 9.

In the sixth embodiment and the seventh embodiment, the resistor 9 can reduce a response time of the optical sensor structure M, particularly a rise time (Tr) in the response time. The response time is a sum of the rise time (Tr) and a fall time (Tf), and Tr represents the time required for the photocurrent generated by the optical sensor structure M to rise from 10% to 90% (a constant photocurrent output by the optical sensor structure M being 100%) and Tf represents the time required for the photocurrent to fall from 90% to 10%.

In this embodiment, after adding the parallel resistance (i.e., the resistor 9), the rise time (Tr) can be shortened. That is, an overall response speed of the optical sensor structure M can be faster. In one preferred embodiment of the present disclosure, the parallel resistance (i.e., the resistor 9) is within the range of 100K to 10M ohm. In Table 1 below, the percentage (%) of the rise time (Tr) by adding the parallel resistance that has different values to the rise time (Tr) without adding the parallel resistance is shown. The percentage reduction in the rise time (Tr) of the parallel resistance (i.e., the resistor 9) having different values can be observed from Table 1. In one most preferred embodiment of the present disclosure, the parallel resistance (i.e., the resistor 9) has a resistance of 1M ohm. When the parallel resistance is 1M ohm, the rise time (Tr) can be reduced by approximately 30%.

| the parallel resistance (i.e., the resistor 9) (unit: ohm) | the percentage (%) of rise time (Tr) by adding the parallel resistance to the rise time (Tr) without adding the parallel resistance |
| --- | --- |
| 100K | 77.6% |
| 1M | 69.9% |
| 10M | 91.3% |
| 100M | 95.6% |
| without adding the parallel resistance | 100% |

In addition, it should be noted that the above-mentioned embodiments are only intended to illustrate different configurations provided by the present disclosure and are not intended to limit the scope of the present disclosure. Therefore, the structure of the components described in each of the embodiments can also be adjusted and adapted.

For example, in another embodiment not shown in the figures of the present disclosure, the optical sensor structure M includes the substrate 1, the light sensing unit 2, the peripheral wall 3, the reflective layer 5, the base layer 6, the lens unit 7, and the resistor 9. The substrate 1 includes the plurality of metal pads 10. The light sensing unit 2 is disposed on the substrate 1 and is electrically connected to the plurality of metal pads 10. The peripheral wall 3 is disposed on the substrate 1, and the peripheral wall 3 and the substrate 1 define the accommodating space 4. The plurality of metal pads 10 and the light sensing unit 2 are positioned in the accommodating space 4, and the reflective layer 5 is also positioned in the accommodating space 4. The reflective layer 5 surrounds the light sensing unit 2, and the upper surface 20 of the light sensing unit 2 is exposed in the accommodating space 4 and not covered by the reflective layer 5. The lens unit 7 is stacked on the peripheral wall 3. The base layer 6 is disposed in the accommodating space 4 and surrounds the light sensing unit 2, and the base layer 6 is positioned below the reflective layer 5. The surface 72 of the lens unit 7 facing away from the light sensing unit 2 is coated with the anti-reflection layer 8. The upper surface 20 of the light sensing unit 2 is coated with the thin film 21.

However, the above-mentioned example is only one of the feasible embodiments, and is not intended to limit the scope of the present disclosure.

Beneficial Effects of the Embodiments

One of the beneficial effects of the present disclosure is that, by the technical solution of "the reflective layer being disposed in the accommodating space and surrounding the light sensing unit", the optical sensor structure M provided in the present disclosure can increase the amount of the light incident to the light sensing unit 2 in the optical sensor structure M, thereby increasing the photocurrent generated by the light sensing unit 2.

Furthermore, the optical sensor structure M provided in the present disclosure can reduce the response time and improve the response speed of the optical sensor structure M by the resistor 9 being connected in parallel with the light sensing unit 2 to form the parallel resistance.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical sensor structure, comprising:
    a substrate including a plurality of metal pads;
    a light sensing unit disposed on the substrate and electrically connected to the plurality of metal pads;
    an peripheral wall disposed on the substrate, the peripheral wall and the substrate defining an accommodating space, and the plurality of metal pads and the light sensing unit being positioned in the accommodating space; and
    a reflective layer disposed in the accommodating space and surrounding the light sensing unit, wherein the reflective layer directly contacts a lateral surface of light sensing unit and is inclined upward from the light sensing unit toward the peripheral wall.

2. The optical sensor structure according to claim 1, wherein the light sensing unit is a Schottky diode or a photoresistor.

3. The optical sensor structure according to claim 1, wherein an upper surface of the light sensing unit is coated with a thin film, and a refractive index of the thin film is less than a refractive index of the light sensing unit.

4. The optical sensor structure according to claim 3, wherein a material of the thin film is silicone or fluoropolymer.

5. The optical sensor structure according to claim 1, wherein the reflective layer includes silicone or fluoropolymer.

6. The optical sensor structure according to claim 1, wherein the reflective layer includes a dopant, and the dopant is one or more selected from the group consisting of: polytetrafluoroethylene, fluorinated ethylene propylene, polyfluoroalkoxy, ethylene-tetra-fluoro-ethylene, and zirconium dioxide.

7. The optical sensor structure according to claim 6, wherein the dopant is 30% to 70% by weight of the reflective layer.

8. The optical sensor structure according to claim 1, wherein a top surface of the light sensing unit is parallel to a surface of the substrate, and the light sensing unit is rotated relative to the surface of the substrate by a rotation angle, and wherein an axis parallel to the surface of the substrate is defined along a center of the substrate, another axis parallel to the top surface of the light sensing unit is defined along a center of the light sensing unit, and the rotation angle is defined between the two axes.

9. The optical sensor structure according to claim 8, wherein the rotation angle is between 40 degrees and 50 degrees.

10. The optical sensor structure according to claim 1, further comprising a base layer, wherein the base layer is disposed in the accommodating space and surrounds the light sensing unit, and the base layer is positioned below the reflective layer.

11. The optical sensor structure according to claim 10, wherein the base layer is selected from the group consisting of: silicone, fluoropolymer, polytetrafluoroethylene, fluorinated ethylene propylene, polyfluoroalkoxy, ethylene-tetra-fluoro-ethylene, and any combination thereof.

12. The optical sensor structure according to claim 10, wherein a contact surface of the base layer and the reflective layer is not higher than an upper surface of the light sensing unit.

13. The optical sensor structure according to claim 1, further comprising a lens unit stacked on the peripheral wall.

14. The optical sensor structure according to claim 13, wherein the lens unit is coated with an anti-reflection layer.

15. The optical sensor structure according to claim 1, further comprising a resistor electrically connected to the light sensing unit.

16. The optical sensor structure according to claim 15, wherein the reflective layer covers the resistor.

17. The optical sensor structure according to claim 15, wherein the resistor is disposed on the substrate and is connected in parallel with the light sensing unit.

18. The optical sensor structure according to claim 15, wherein the resistor is disposed on the substrate, the light sensing unit is stacked on the resistor, and the resistor is connected in parallel with the light sensing unit.

* * * * *